United States Patent [19]

Morisaki et al.

[11] 4,010,005
[45] Mar. 1, 1977

[54] COPPER FOIL HAVING BOND STRENGTH

[75] Inventors: Shigeyoshi Morisaki, Ageo; Kazuo Mase, Tokyo, both of Japan

[73] Assignee: Mitsui-Anaconda Electro Copper Sheet Co., Ltd., Japan

[22] Filed: June 10, 1974

[21] Appl. No.: 477,587

[30] Foreign Application Priority Data

June 23, 1973 Japan .............................. 48-70447

[52] U.S. Cl. .................................. 29/195; 204/16
[51] Int. Cl.² ......................................... B32B 15/20
[58] Field of Search ........ 29/195 P, 195 W, 195 Y, 29/195 M, 194; 204/16

[56] References Cited

UNITED STATES PATENTS

| | | | |
|---|---|---|---|
| 3,152,972 | 10/1964 | Brown et al. | 204/41 |
| 3,152,973 | 10/1964 | Tomaszewski et al. | 204/41 |
| 3,298,802 | 1/1967 | Odekerken | 29/194 |
| 3,449,223 | 6/1969 | Odekerken | 204/41 |
| 3,471,271 | 10/1969 | Brown et al. | 29/183.5 |
| 3,585,010 | 6/1971 | Luce et al. | 29/191.2 |
| 3,666,636 | 5/1972 | Tomaszewski et al. | 204/16 |
| 3,753,667 | 8/1973 | Metzger | 29/195 |
| 3,857,681 | 12/1974 | Yates et al. | 29/195 |

*Primary Examiner*—L. Dewayne Rutledge
*Assistant Examiner*—E. L. Weise
*Attorney, Agent, or Firm*—Bucknam and Archer

[57] ABSTRACT

A copper foil having high bond strength with an insoluble particle-containing metal plate formed thereon, the plated copper foil being adapted for use in the preparation of, for example, a printed circuit.

11 Claims, No Drawings

COPPER FOIL HAVING BOND STRENGTH

This invention relates to a copper foil and more particularly it relates to a surface-treated, copper foil having high bond strength which is adapted for use in the preparation of a printed circuit or the like.

Conventionally, a copper foil for a printed electric circuit is bonded to a synthetic resin-made substrate to form a copper-clad laminate which allows a desired circuit to be printed thereon and the unnecessary portions of the foil to be removed therefrom by etching. The printed circuit board is provided with various parts for the electric circuit and subjected to necessary soldering, thereby obtaining a product for use in the electronic industry. With the progress of the electronic industrial techniques, copper foils tend to be required to have increasingly high-level properties such as bond strength, heat resistance, electrical properties, printability, etching property and appearance after etching. In order to enhance the bond strength among all the aforesaid properties of the copper foil, there has heretofore been widely used a process for the surface treatment of the copper foil, that is, the formation of a rough copper layer thereon by plating the copper foil with copper using the copper foil as the cathode at a current density approximating the limiting current density. Such conventional process will comparatively easily give a product having an increased bond strength; while it will allow deposited copper to easily develop into dendrite which still remains after etching, whereby the product tends to have unsatisfactory electrical properties and appearance.

It is therefore an object of this invention to provide a copper foil which is characterized by freedom from the aforesaid drawbacks of the conventionally surface-treated copper foil, i.e., by high bond strength and absence of undesirable materials left on the foil.

This and other objects, as will be hereinafter become more readily apparent, can be attained by the provision of a copper foil which is characterized by the formation thereon of a layer of a metal or alloy containing insoluble fine particles by plating. The metal layer-covered copper foil has a remarkably high bond strength due to the fine projections or roughness produced by the insoluble fine particles contained in the metal layer, and the projections never cause the foil to be deteriorated in appearance and electrical properties since, unlike the aforesaid conventional deposited copper, they do not develop into dendrite and remain after etching.

One of the preferable processes for preparing the metal layer-covered copper foils of this invention comprises suspending insoluble fine particles in a plating solution of a suitable metal and electroplating a starting copper foil as the cathode in the thus-prepared plating solution containing the particles to form a particle-containing metal layer on the starting copper foil thereby obtaining the metal layer-covered copper foil of this invention.

Metals or alloys to be plated on a copper foil according to this invention, include not only copper but also other metals and alloys which will not have adverse effects on the properties necessary for a copper foil for printed circuits. The other metals and alloys are, for example, brass, bronze, nickel, zinc, cadmium, indium and chromium.

The insoluble fine particles which may be suspended in the plating solution are required to be such that they are of course insoluble and dispersible in the plating solution and, furthermore, they are insulating electrically and are stable chemically and thermally. The reason for the particles being required to be of electrical insulation is that they will be contained in a metal layer formed on a copper foil and will partly remain on the substrate after etching, whereby the electrical properties of a printed circuit being obtained from the plated copper foil would be impaired if the particles were not of electrical insulation; and the reason for the particles being required to be stable chemically and thermally is to enable the resulting printed circuit to resist thermal treatments such as soldering and to keep its satisfactory quality and appearance without its degradation with the lapse of time. Particles which meet such requirements include inorganic compounds such as particulate silica, alumina, glass, barium sulphate and mixtures thereof and also include organic high polymers such as particulate epoxy resin, phenolic resin, polyvinylbutyral resin and mixtures thereof. The plated copper foils containing said organic high polymer in the plate layer are capable of being securely bonded to a substrate without adhesives by superposing the foil on the substrate and heating them under pressure and, therefore, they are useful not only for printed circuits but also as material for laminated articles.

Such fine particles are preferably $0.1 - 10 \mu$ in particle size and may preferably be suspended in the plating solution in amounts of about $10 - 200$ g per liter of the solution. If the particles have a particle size outside said range and are used in amounts outside said range, they will render it difficult to obtain plated copper foils which are excellent in bond strength and other properties as mentioned above.

The plating conditions used herein are not particularly different from usual ones and they are only required to be those under which a metal to be deposited will not develop into dendrite.

This invention will be better understood by the following examples.

EXAMPLE 1

Copper layer-covered copper foil of a conventional type, that of this invention and that of a usual type were prepared by plating 35 $\mu$ thick electrolytic copper foils as the cathodes with copper in copper plating solutions under the operational conditions shown in Table 1, respectively. The copper layer-covered copper foil of the usual type is the one which was prepared in the same manner as the product of this invention except that the copper plating solution used had no insoluble fine particles suspended therein. In Table 1 are shown the plating conditions, the appearance of each copper-plated copper foil thus prepared, and the properties of laminated articles each prepared by superposing the plated copper foil on a prepreg composed of epoxy resin-impregnated glass cloth and then curing the whole mass under pressure in the usual manner.

EXAMPLE 2

The procedure of Example 1 was followed except that the copper plating solution was replaced by a brass plating solution. The results are shown in Table 2.

Table 1

|  |  | Conventional product | Invented product | Usual Product |
|---|---|---|---|---|
| Plating conditions | | | | |
| Barium sulfate powder (Average particle size: 3 $\mu$) | g/l | 0 | 20 | 0 |
| $CuSO_4 \cdot 5H_2O$ | g/l | 40 | 150 | 150 |
| $H_2SO_4$ | g/l | 20 | 40 | 40 |
| Temperature | °C | 20 | 25 | 25 |
| Time of electrolysis | sec. | 40 | 20 | 20 |
| Cathode current density | A/dm² | 10 | 10 | 10 |
| Appearance of plating | | Dendritic deposit found | Many granular deposits found, and no dendritic deposit found | Smooth |
| Properties of laminated article | | | | |
| Bond strength | Kg/cm | 1.77 | 2.07 | 0.83 |
| Remains left after etching | | Found | Not found | Not found |

Table 2

|  |  | Invented product | Usual product |
|---|---|---|---|
| Plating conditions | | | |
| Silica powder (Average particle size: 6 $\mu$) | g/l | 180 | 0 |
| CuCN | g/l | 27 | 27 |
| $Zn(CN)_2$ | g/l | 9 | 9 |
| NaCN | g/l | 56 | 56 |
| $Na_2CO_3$ | g/l | 30 | 30 |
| Temperature | °C | 35 | 35 |
| Time of electrolysis | sec. | 40 | 40 |
| Cathode current density | A/dm² | 10 | 10 |
| Appearance of plating | | Many granular deposits found, and no dendritic deposit found | Smooth |
| Properties of laminated article | | | |
| Bond strength | Kg/cm | 2.03 | 0.78 |
| Remains left after etching | | None | None |

EXAMPLE 3

The procedure of Example 1 was followed with the exception that the insoluble particles suspended in the plating solution was substituted by the epoxy resin (supplied under the trademark of ARALDITE 6084 by Ciba Co.). The results are indicated in Table 3.

Table 3

|  |  | Invented product | Usual product |
|---|---|---|---|
| Plating conditions | | | |
| Epoxy resin powder (Average particle size: 1 $\mu$) | g/l | 50 | 0 |
| $CuSO_4 \cdot 5H_2O$ | g/l | 200 | 200 |
| $H_2SO_4$ | g/l | 40 | 40 |
| Temperature | °C | 30 | 30 |
| Time of electrolysis | sec. | 40 | 40 |
| Cathode current density | A/dm² | 10 | 10 |
| Appearance of plating | | Many granular deposits found, and no dendritic deposit found | Smooth |
| Properties of laminated article | | | |
| Bond strength | Kg/cm | 2.10 | 0.80 |
| Remains left after etching | | None | None |

As is detailed above, the plated copper foils of this invention are excellent in properties, which are necessary for copper foils for printed circuits, such as bond strength as well as electrical properties and appearance after etching. This invention has solved such problems that conventional copper foils having high bond strength are apt to be made inferior in electrical properties and appearance after etched and, thus, the plated copper foils of this invention are very useful as material for printed circuits and other laminated articles.

What is claimed is:

1. A plated copper foil having high bond strength comprising a copper foil and an insoluble fine particle-containing metal plating formed thereon.
2. A plated copper foil having high bond strength according to claim 1, wherein the metal is selected from the group consisting of brass, bronze, copper, nickel, zinc, cadmium, indium and chromium.
3. A plated copper foil having high bond strength according to claim 1, wherein the insoluble fine particles are selected from the group consisting of silica, alumina, glass, barium sulfate and mixtures thereof, each in a particulate form.
4. A plated copper foil having high bond strength according to claim 1, wherein the insoluble fine particles are selected from the group consisting of epoxy, phenolic, polyvinylbutyral resins and mixtures thereof, each in a particulate form.
5. A plated copper foil having high bond strength according to claim 1, wherein the insoluble fine particles are 0.1 – 10 $\mu$ in particle size.

6. A plated copper foil having high bond strength according to claim 2, wherein the insoluble fine particles are selected from the group consisting of silica, alumina, glass and barium sulfate, each in a particulate form.

7. A plated copper foil having high bond strength according to claim 2, wherein the insoluble fine particles are selected from the group consisting of epxoy, phenolic and polyvinylbutyral resins, each in a particulate form.

8. A copper foil having a plating of a metal selected from the group consisting of brass, bronze, copper, nickel, zinc, cadmium, indium and chromium, said metal plating containing fine particles of a substance electrically insulating and chemically and thermally stable, selected from the group consisting of silica, alumina, glass, barium sulfate and mixtures thereof, prepared by electroplating said copper foil as the cathode in a bath of a plating solution of said metal, said bath containing fine particles of said electrically insulating and chemically and thermally stable substance.

9. A plated copper foil according to claim 6 wherein the particles are barium sulfate particles of average particle size 3 microns, the metal plating is of copper, said foil is free of dendritic deposits and has 2.07 kg/cm bond strength.

10. A plated copper foil according to claim 6 wherein the particles are silica powder of average particle size 6 microns, the metal plating is brass, said foil is free of dendritic deposits and has 2.03 kg/cm bond strength.

11. A plated copper foil according to claim 6 wherein the particles are an epoxy resin of average particle size 1 micron, the metal plating is of copper, said foil is free of dendritic deposits and has 2.10 kg/cm bond strength.

* * * * *